Aug. 14, 1973 R. V. GOORDMAN ET AL Re. 27,730

DIFFERENCE AMPLIFIER WITH PARALLEL ISOLATED EMITTER CONFIGURATION

Original Filed Aug. 19, 1969

2 Sheets-Sheet 1

INVENTORS R.V. GOORDMAN
R.C. PETERSEN

BY

ATTORNEY

United States Patent Office

Re. 27,730
Reissued Aug. 14, 1973

27,730

DIFFERENCE AMPLIFIER WITH PARALLEL ISOLATED EMITTER CONFIGURATION

Robert Victor Goordman, Hackettstown, and Ronald Charles Petersen, Bedminster, N.J., assignors to Bell Telephone Laboratories Incorporated, Murray Hill, N.J.

Original No. 3,559,087, dated Jan. 26, 1971, Ser. No. 851,378, Aug. 19, 1969. Application for reissue Apr. 26, 1971, Ser. No. 137,283

Int. Cl. H03f *3/68*

U.S. Cl. 330—15 10 Claims

Matter enclosed in heavy brackets [ ] appears in the original patent but forms no part of this reissue specification; matter printed in italics indicates the additions made by reissue.

ABSTRACT OF THE DISCLOSURE

A transistor difference amplifier is disclosed in which one side thereof, called side A, contains a plurality of n transistor elements equal in number to the transistor elements in the other side, called side B. Moreover, each of the emitters in side A is separately electrically connected, through a resistor for example, to a corresponding emitter in side B. The electrical midpoint, or balance point, of the electrical path defined by each emitter to emitter acts as a virtual ground. The existence of the virtual ground permits the transfer of emitter signal current from side A to side B through n separate emitter to emitter paths without the necessity of passing through an actual earth or chassis ground return path, thereby enabling high power handling capacity while minimizing emitter circuit lead and ground plane inductance. In addition, parasitic coupling to adjacent circuits through the ground plane is avoided.

FIELD OF THE INVENTION

Figure 1:
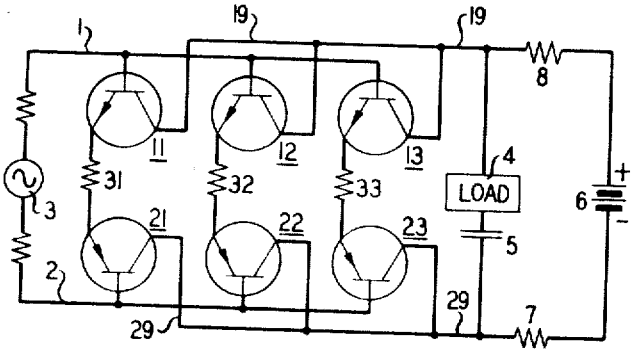

This invention relates to the field of electrical signal amplifiers and, more particularly, to semiconductor difference amplifiers.

BACKGROUND OF THE INVENTION

In a system for amplifying an electrical signal supplied by a signal source, the problem of "pickup" noise and distortion of the signal arises in the transmission line between the signal source and the amplifier.

It is known, however, that the difference amplifier, with its relatively high gain for differential mode input voltage levels and relatively low gain for common mode voltage levels, can be used to circumvent this distortion problem.

In the "balanced common mode" technique, for example in its simpler aspect, the signal from the source is transmitted to the amplifier along two identical transmission wires, one of which is fed with the signal of opposite algebraic sign from the other. A difference amplifier receives these two signals of opposite sign and amplifies the difference thereof. On the other hand, noise and distortion picked upon on both transmission wires due to the same causes, reach the difference amplifier with the same algebraic sign ("common mode"). Therefore, the output of this difference amplifier represents the desired amplified representation of the original signal, while any "common mode" noise or distortion is rejected (cancelled out) in the difference amplifier. Thus, any noise or distortion introduced similarly into both transmission wires, i.e., "common mode" noise or distortion, does not appear in the amplified output.

On the other hand, the difference amplifier can be used to advantage in the single ended or unbalanced configuration. In this configuration, the input signal is applied to the base of side A with the base of side B grounded, with the collector of side A short circuited to the power supply. The output is derived from the collector of side B. The advantage of the single ended or unbalanced difference amplifier configuration is that so-called Miller feedback capacitance from load to source is reduced by orders of magnitude; and, since the collector of side A is not driving a load, the collector voltage required and the power dissipated in side A is quite low.

However, in the frequency range of the order of 50 to 5000 mHz., high frequency transmission lines (rather than simple wires) are ordinarily used for transmitting the signal from source to amplifier. Moreover, the problem of rejecting the "pickup" noise and distortion still remains. If waveguides are used for transmitting the signal from source to amplifier, it is true that the parasitic inductance introduced by the waveguides can be "tuned out" by means of auxiliary elements. However, the bandwidth is limited to the order of a single octave by reason of the waveguides, which is far below the bandwidth capability of an ordinary transistor amplifier itself. On the other hand, if coaxial lines are used for transmitting the signal from source to amplifier, it is difficult to couple the coaxial line into the amplifier efficiently due to the undistributed parasitic inductance in this coupling interface. In turn, this parasitic interface inductance gives rise to reflections of the incoming waves from the source to the amplifier, which deteriorates the efficiency of the amplifier. In another aspect, this interface inductance introduces an equivalent series circuit with the time constant of the order of $(L/R_o)$ where L is the inductance and $R_o$ is the characteristic impedance of the transmission line. This time constant is typically of the order of 2000 mHz., so that signals of this frequency and above are seriously attenuated by reason of the transmission line.

In addition to base input interface inductance, there is the emitter access lead or emitter interface inductance. These two interface inductances are similar in magnitude, however, the emitter circuit at current level in excess of 25 ma. has an $L/r_e$ time constant of at least 50 times the base interface time constant so that forward transfer admittance $Y_{fe}$ begins to deteriorate at about 50 mHz.

Commercial high power transistors are available with multiple emitter diffusions which tend to minimize the internal component of $L/r_e$; however, the emitter lead joining all these emitters to the ground plane, and the ground plane itself, still result in an interface emitter time constant which begins to degrade $Y_{fe}$ below 50 mHz.

SUMMARY OF THE INVENTION

In order to reduce the deleterious effects of emitter lead inductance, a high power difference amplifier is built of two equal pluralities of transistors as follows. To each individual transistor in side A of the difference amplifier, there exists a corresponding individual transistor ("mate") in the side B, forming a pair of corresponding transistors ("twins") with corresponding emitters, bases, and collectors.

In the case of a plurality of complementary twins, i.e., PNP transistors on one side and NPN transistors on the other side, the emitter of each PNP is separately connected through an ohmic resistor, for example, only to the emitter of its corresponding NPN mate. Either a balance or an unbalanced common mode circuit can be realized by appropriate arrangement of the signal source circuit input.

In the case of a plurality of noncomplementary twins in addition to the separate connection by ohmic resistors, for example, the midpoint of the connection between each emitter on side A and its corresponding emitter on side B is itself connected, through another ohmic resistor, for example, separately to a voltage source. The current paths in both complementary and noncomplementary cases are thus arranged such that negligible signal current flows from any one emitter pair to any other emitter pair. In the balanced difference amplifier configuration, in accordance with this invention, a virtual ground is created midway between each pair of the emitters of corresponding transistors. Moreover, the unbalanced difference amplifier configuration can also be utilized according to another embodiment of the invention. In such a case, the advantages generally discussed above of the unbalanced over the balanced common modes can be realized. However, there is a reflected ground plane between corresponding emitter mates due to the grounding of one base of the unbalanced common mode arrangement, but the current gain mechanism of the transistors tends to minimize the effect of this reflected ground plane which otherwise might degrade the advantage of the individual emitter to emitter resistor.

The circuit arrangements in this invention as just described avoids the need for an actual ground plane, so that the lead inductance to the emitters of the transistors is minimized. Thereby, these circuit arrangements permit amplification in a difference amplifier configuration with high power levels (over 1 watt), with minimal pickup noise and distortion, over the broadband of 50 mHz. to 10 gHz. or more.

In an integrated type of circuit configuration of this invention, in addition to the advantage of the above-described reduction in emitter lead inductance, the collector lead inductance can also be reduced. This can advantageously be accomplished by locating each branch of the difference amplifier just described on opposite sides of an insulating substrate, such that each and every pair of corresponding collectors of the individual transistors of both branches of the difference amplifier are located directly opposite each other.

In a particularly embodiment of this invention, an array of substantially identical PNP transistors are located on a first side of an insulating ceramic substrate. All of these PNP transistors are fabricated in a single semiconductor "chip" or slice. The collectors of all these PNP transistors are connected together by a common collector rail in the form of a metallic stripe deposited on the chip. This collector rail is connected to the load and the D.C. bias. On the second side of the insulating ceramic substrate (opposite the first side thereof) is located an array of substantially identical NPN transistors, i.e., complementary to the PNP transistors on the first side of the ceramic substrate. Each of these NPN transistor is located laterally at a position on the second side of the ceramic substrate which is directly opposite its mate PNP transistor on the first side of this ceramic substrate. Each of the emitters of the NPN transistor is separately electrically connected to its mate PNP transistor on the other side of the ceramic substrate through a separate resistor. Each resistor has a resistance sufficient to prevent burn-out due to "thermal runaway" which might otherwise occur due to current "hogging" by one pair of transistor junctions as compared with the others. Finally, all the electrical bases of the NPN transistors are ohmically connected together to a common base terminal for applying thereto one polarity of the signal input (balanced or unbalanced); while all the electrical bases of the PNP transistors are similarly connected together to another common base terminal for applying thereto the other polarity of the signal input.

Moreover, a push-pull circuit arrangement can be realized in accordance with this invention, in order to achieve the known benefits of push-pull amplifiers of cancellation of even harmonic distoration and high power efficiency.

Figure 2:
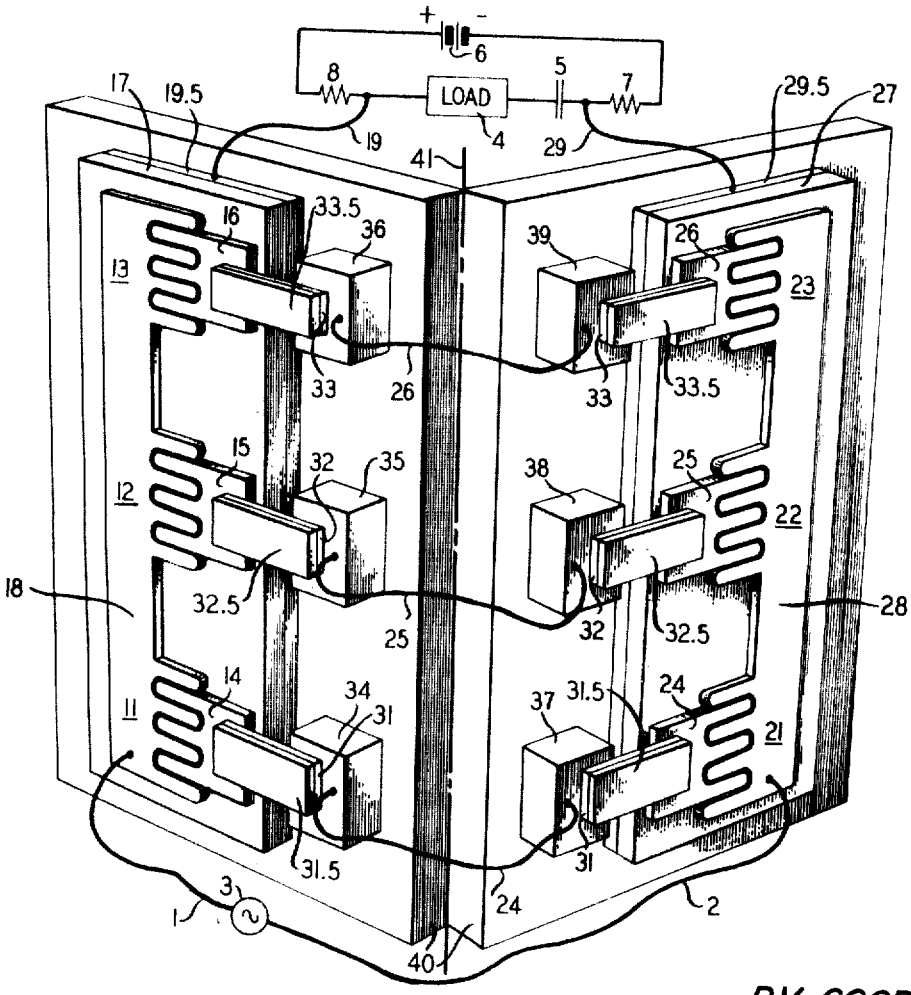
Figure 4:
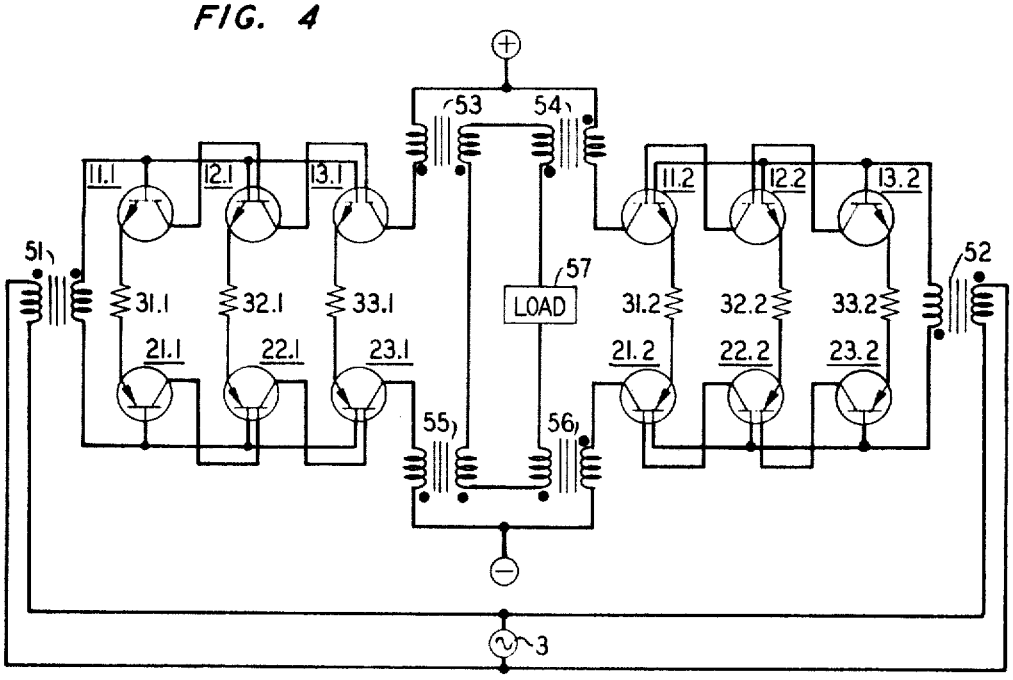
Figure 3:
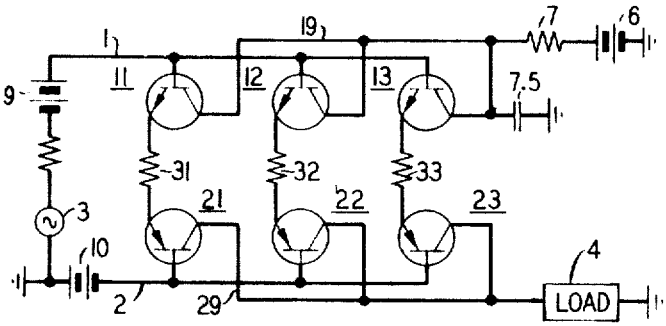
Figure 5:
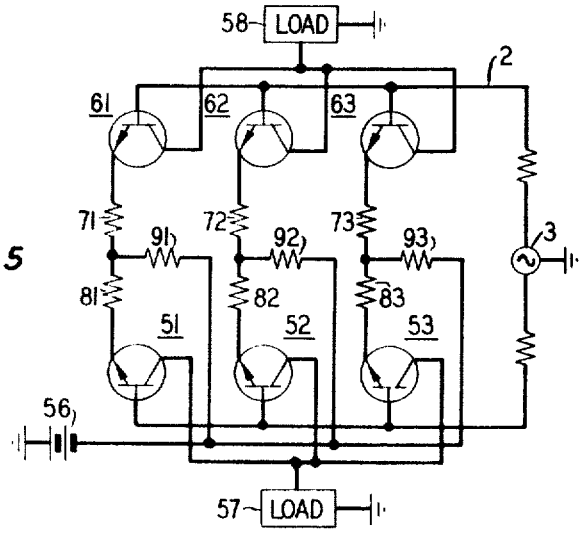

This invention, together with its features, objects, and advantages may be better understood from the following detailed description when read in conjunction with the diagram in which FIG. 1 shows a circuit diagram of an amplifier according to a specific embodiment of this invention;

FIG. 2 shows an integrated type of circuit arrangement of the circuit shown in FIG. 1; and FIG. 3 shows a circuit diagram of an amplifier according to another specific embodiment of this invention; and FIG. 4 shows a circuit diagram of an amplifier according to still another specific embodiment of this invention; and FIG. 5 shows a circuit diagram of an amplifier according to still another specific embodiment of this invention.

DETAILED DESCRIPTION

FIG. 1 shows a circuit diagram of a balanced common mode difference amplifier, including complementary transistors on two branches thereof, according to a specific embodiment of this invention. By electrical connection through base leads 1 and 2, a signal source 3 provides an electrical signal which drives the bases of the substantially identical NPN transistors 11, 12, and 13 in the opposite sense of polarity from the bases of the substantially identical PNP transistors 21, 22, and 23. The emitter of transistor 11 is electrically connected through the ohmic resistor 31 to the emitter of its mate or twin transistor 21. Likewise, ohmic resistors 32 and 33 electrically connect the emitters of transistor 22 and 23 to the emitters of transistors 12 and 13, respectively. The collectors of the transistors 11, 12, and 13 are electrically connected together and to one side of a load 4 by means of a common wire lead 19; whereas the collectors of transistors 21, 22, and 23 are electrically connected together and to the other side of the electrical load 4 by means of a common wire lead 29 through a D.C. blocking capacitor 5. The D.C. battery 6 supplies bias voltages to the transistors 11, 12, and 13; as well as to the transistors 21, 22, and 23; through the ohmic resistors 7 and 8, respectively.

Typically, each of the ohmic resistors 7 and 8 has a resistance advantageously at least an order of magnitude larger than the preferably equal dynamic resistances of the transistors 11, 12, 13, 21, 22, and 23. Moreover, typically each of the substantially identical ohmic resistors 31, 32, and 33 has a resistance advantageously at least equal to the dynamic resistance of the emitter-base diode of the transistors to which it is connected, in order to prevent "burn-out" due to current "hogging" by any individual transistor pair.

FIG. 2 shows an integrated version of the circuit shown in FIG. 1. Electrical elements in FIG. 2 which correspond to the electrical elements in FIG. 1 have been designated by the same reference numerals.

It is to be understood that the left-hand half of the drawing in FIG. 2 represents a view of the top side of a ceramic insulating substrate 40, whereas the right-hand half of this drawing shows the view of the bottom side of this same single ceramic substrate 40. This substrate 40 has been broken into these halves only for the convenience of illustration. The center line 41 indicates the 180° of relative rotation from the bottom to top of the insulating substrate 40. For the sake of symmetry and desirable transmission line properties at frequencies of the order of 10 gHz. or more, the resistors 31, 32, and 33 shown in FIG. 2 have been split relative to those shown in FIG. 1 into two equal halves on either side of the substrate 40. Each of these resistors 31–33 typically is made of a resistive film which has been vapor deposited by known methods upon ceramic substrates 31.5, 32.5, and 33.5, for mechanical support. Alternatively, they can be integrated into the semiconductor substrates 17 and 27, in known manner. Metal pads 34–39, to each of which a single first terminal of each of these resistors 31–33 is bonded, are connected in pairs by metal wire leads 24–26 as indicated in FIG.

2. The other second terminal of each of the resistors 31–33 is bonded to each of the respective emitter terminals 14, 15, 16 and 24, 25, 26 of the transistors 11, 12, 13 and 21, 22, 32, respectively. All these transistors are formed in the semiconductor substrates 17 and 27 typically by known methods of epitaxial growth and diffusion of impurities. Moreover, by means of these techniques, each of the transistors 11, 12, 13 and 21, 22, 23 are electrically effectively isolated from one another. Metal base rail contacts 18 and 28 connect together the bases of the transistors 11, 12, 13 and 21, 22, 23. Typically, the semiconductor substrates 17 and 27 are bonded to metal plates 19.5 and 29.5, respectively, in order to furnish collector terminals for these transistors to which the external collector wire leads 19 and 29 are bonded. In turn, the metal plates 19.5 and 29.5 are attached to the top and bottom major surfaces of the ceramic insulating substrate 40.

It should be stressed that it is advantageous to fabricate each of the transistors 11, 12, 13 on the top side of the ceramic substrate 40 to be in a mirror image mutual relationship with its mate transistor 21, 22, 23, respectively, on the bottom side. In particular, the collector leads 19 and 29 as well as the metal plates 19.5 and 29.5 are located opposite each other on opposite major surfaces on the ceramic substrate 40, so that all the collector current paths on opposite sides of the substrate are substantially in the opposite geometric direction from one another. Thereby, the collector lead inductance is minimized as desired in this invention. It should be obvious to the skilled worker that the collector transmission line impedance can be controlled by controlling the separation between the metal plates 19.5 and 29.5, in turn, by controlling the thickness of the ceramic substrate 40. Thereby, a balanced transmission line impedance can be achieved in the collector circuit.

FIG. 3 shows a circuit diagram of an unbalanced common mode difference amplifier, which is similar to that shown in FIG. 1 except that the signal source 3 is arranged for the unbalance common mode. The same reference numerals are used in FIG. 3 as in FIG. 1 to denote similar electrical elements. In addition, it is useful to insert a bypass capacitor 7.5, as shown in FIG. 3, to bypass voltage source 6 and resistor 7.

It should be obvious the circuit shown in FIG. 3 can easily be translated into an integrated circuit type of configuration similar to that shown in FIG. 2 except for the connections of the signal source 3 and electrical load 4 to the transistors, as well as the interposition of auxiliary batteries 9 and 10 to bias the bases of all these transistors 11, 12, 13 and 21, 22, 23 to a suitable voltage as known in the art.

Typically for class A operation, batteries 9 and 10, with polarities as shown, each supply an E.M.F. of 0.5 volt or greater depending on the emitter resistors and the desired emitter current operating point. For class B operation, the batteries 9 and 10 should be between zero and 0.50 volt with polarities as shown.

FIG. 4 shows a circuit diagram of a balanced common mode difference amplified in a push-pull arrangement, according to another embodiment of this invention. The transistors 11.1, 12.1, and 13.1, together with their mate transistors 21.1, 22.1 and 23.1 in combination with emitter resistors 31.1, 32.1, and 33.1, form a first difference amplified similar to that shown in FIG. 1. Therefore, the configuration shown in FIG. 2 may be used for an integrated circuit type of realization of this portion of the push-pull amplified. Likewise, the transistors 11.2, 12.2, and 13.2 together with their mate transistors 21.2, 22.2, and 23.2 in combination with emitter to emitter resistors 31.2, 32.2, and 33.2 form a second difference amplifier again similar to that shown in FIG. 2; and therefore it is feasible again to have an integrated circuit realization thereof. The transformers 51–56 are arranged with their respective primary and secondary windings in suitable orientation such that push-pull operation results, as should be obvious to those skilled in the art. The advantages of push-pull operation are well known, in its cancellation of the even harmonic distortion and its high power efficiency.

FIG. 5 shows a balanced common mode circuit arrangement of noncomplementary and preferably otherwise identical transistors in a difference amplifier according to another specific embodiment of this invention. By electrical connection through base leads 1 and 2, the signal source 3 drives all the bases of the NPN transistor 51, 52, and 53 in the opposite sense from the bases of their mate NPN transistors 61, 62, and 63. Each of the emitters of transistors 51, 52, 53 is electrically connected through ohmic resistors 71, 72, 73 and 81, 82, 83, respectively, separately to each of the emitters of the transistors 61, 62, 63. The collectors of the transistors 51, 52, 53 are electrically connected together and to one side of a first load 57; whereas the collectors of the transistors 61, 62, 63 are electrically connected together and to one side of a second load 58. Of course, either of the loads 57 or 58 may be omitted.

The D.C. battery 56 supplies bias voltages to the transistors 51, 52, 53 and 61, 62, 63 through ohmic resistors 91, 92, 93, respectively. Typically, the resistors 91, 92, 93 are each advantageously at least an order of magnitude larger than the preferably equal dynamic resistances of the transistors 51, 52, 53 and 61, 62, 63. Moreover, typically each of the resistors 71, 72, 73 and 81, 82, 83 has a resistance advantageously at least equal to the dynamic resistance of the emitter-base diode of the transistors to which it is connected, in order to prevent "burn-out" due to current "hogging" by any individual transistor.

It is obvious that the circuit shown in FIG. 5 can easily be modified to operate in the unbalanced common mode with its attendant advantages discussed above, simply by locating the ground on one side of the signal source 3 instead of the center thereof. Moreover, all the transistors 51, 52, 53 and 61, 62, 63 can be PNP, instead of NPN, with appropriate rearrangement of the polarity of the battery 56. Moreover, the circuit shown in FIG. 5 can easily be translated into an integrated circuit configuration similar to that shown in FIG. 2 with obvious modifications thereof.

While the circuits shown in FIGS. 1–5 contain only three transistors in any given side thereof, it is obvious that for higher power handling capacity, it may be desirable to utilize many more than three such transistors in each side. As many as one hundred or more such transistors advantageously can be used for high power handling capacity. Any individual transistor which does not operate properry preferably should be removed from the circuit together with its twin. In a miniaturized integrated circuit configuration, the removal of any individual transistor can be accomplished by means of burning it out with a laser beam, for example.

What is claimed is:

1. An amplifier which comprises:

(a) a plurality of first transistor elements, *all said first transistor elements being electrically connected in a mutually parallel and parallel functioning relationship*, forming a first array;

(b) a like plurality of second transistor elements, *all said second transistor elements being electrically connected in a mutually parallel and parallel functioning relationship*, forming a second array;

(c) a like plurality of electrically conductive first means for separately connecting each of the emitter terminals of each of the transistor elements in the first array to the emitter terminal of its mate in the second array, the emitter terminals of each transistor element in the first array being effectively electrically isolated from each other and the emitter terminals of each of the transistor elements in the second array being effectively electrically isolated from each other;

(d) electrically conductive second means for connecting together the collector terminals of all of the transistor elements of the first array;

(e) electrically conductive third means for connecting together the collector terminals of the transistor elements of the second array;

(f) electrically conductive fourth means for connecting together the base terminals of all of the transistor elements of the first array; and (g) electrically conductive fifth means for connecting together the base terminals of all of the transistor elements of the second array.

2. An amplifier according to claim 1 in which the first means include ohmic resistors.

3. An amplifier according to claim 1 in which the first transistor elements are all substantially identical NPN transistors and the second transistor elements are all substantially identical PNP transistors.

4. An amplifier according to claim 1 in which the first array together with the second means is physically located on one major surface of an insulating substrate and the second array together with the third means is physically located on an opposing major surface of said substrate, such that the collector current paths in the first array are substantially in the geometrically opposite direction from the current paths in the second array.

5. An amplifier according to claim 1 which further includes an electrical signal source which is electrically connected to the fourth means, and an electrical load which is electrically connected to the second means.

6. An amplifier according to claim 1 which further includes an electrical signal source which is electrically connected to the fourth means, in order to apply the signal thereto in a first sense of polarity, and an electrical load which is electrically connected to the third means.

7. An amplifier according to claim 6 which further includes means for electrically connecting the signal source to the fifth means in order to apply the signal thereto in the sense of polarity opposite from the first sense.

8. A push-pull amplifier which comprises:

(a) a first amplifier in accordance with claim 1;

(b) a second amplifier in accordance with claim 1; and (c) sixth means for electrically connecting collector terminals of the transistors of the first array of the first amplifier to the collector terminals of the transistors of the first array of these second amplifier.

9. The push-pull amplifier of claim 8 in which the sixth means include the primary windings of a transformer.

10. The push-pull amplifier of claim 9 in which the secondary windings of the transformer are serially electrically connected to a load.

References Cited

The following references, cited by the Examiner, are of record in the patented file of this patent or the original patent.

UNITED STATES PATENTS 3,500,221 3/1970 Mercier ---------- 330—30

OTHER REFERENCES

Hollstein, Jr., "Change Gain Amplifier," IBM Technical Disclosure Bulletin, vol. 10, No. 4, pp. 521–522, September 1967.

ROY LAKE, Primary Examiner

L. J. DAHL, Assistant Examiner

U.S. Cl. X.R.

330—30 R

UNITED STATES PATENT OFFICE
CERTIFICATE OF CORRECTION

Patent No. RE 27730 Dated August 14, 1973

Inventor(s) Robert V. Goordman and Ronald C. Petersen

It is certified that error appears in the above-identified patent and that said Letters Patent are hereby corrected as shown below:

Column 1, line 59, "upon" should be --up on--, delete "on".

Column 2, line 66, "balance" should be --balanced--.

Column 3, line 39, "particularly" should be --particular--.

Column 6, line 53, "properry" should be --properly--.

Column 8, line 13, "these" should be --the--.

Signed and sealed this 19th day of March 1974.

(SEAL)
Attest:

EDWARD M.FLETCHER,JR.
Attesting Officer

C. MARSHALL DANN
Commissioner of Patents

USCOMM-DC 60376-P69
* U.S. GOVERNMENT PRINTING OFFICE : 1969 O—366-334.